United States Patent [19]

Kobayashi

[11] Patent Number: 4,928,161
[45] Date of Patent: May 22, 1990

[54] THIN-FILM TRANSISTOR AND WIRING MATRIX DEVICE AND ITS FORMING METHOD

[75] Inventor: Kenichi Kobayashi, Ebina, Japan

[73] Assignee: Fuji Xerox Co., Ltd., Tokyo, Japan

[21] Appl. No.: 71,951

[22] Filed: Jul. 10, 1987

[30] Foreign Application Priority Data

Jul. 11, 1986 [JP] Japan ................................ 61-164320

[51] Int. Cl.[5] ...................... H01L 23/48; H01L 29/46; H01L 29/54
[52] U.S. Cl. ........................................ 357/71; 357/4; 357/23.7
[58] Field of Search ............................ 357/4, 23.7, 71

[56] References Cited

U.S. PATENT DOCUMENTS

| | | | |
|---|---|---|---|
| 4,065,781 | 12/1977 | Gutknecht | 357/4 |
| 4,119,992 | 10/1978 | Ipri et al. | 357/4 |
| 4,609,930 | 9/1986 | Yamazaki | 357/4 |
| 4,618,878 | 10/1986 | Aoyama et al. | 357/4 |
| 4,646,424 | 3/1987 | Parks et al. | 357/23.7 |
| 4,695,856 | 9/1987 | Warabisako et al. | 357/23.7 |

FOREIGN PATENT DOCUMENTS

| | | | |
|---|---|---|---|
| 0090661 | 5/1983 | European Pat. Off. | 357/23.7 |
| 60-183770 | 9/1985 | Japan | 357/23.7 |
| 61-13665 | 1/1986 | Japan | 357/23.7 |

*Primary Examiner*—Rolf Hille
*Assistant Examiner*—Hoanganh Le
*Attorney, Agent, or Firm*—Sughrue, Mion, Zinn, Macpeak & Seas

[57] ABSTRACT

A thin-film transistor device which is easy to fabricate and which has a high reliability. The device includes a substrate and a thin-film transistor formed thereon including a first conducting layer deposited on the substrate, a gate insulating layer formed on the first conducting layer, a semiconductor layer deposited on the gate insulating layer, and source and drain electrodes on the semiconductor layer. A multi-level wiring section is provided adjacent the thin-film transistor, including a first conducting wiring layer formed on the substrate, wiring insulating layer formed on the first conducting wiring layer, and a second conducting wiring layer deposited on the wiring insulating layer and contacting the first conducting wiring layer as well as a portion of the thin-film transistor. The gate insulating layer and the wiring insulating layer are made of the same inorganic material and are of the same thickness.

8 Claims, 1 Drawing Sheet

THIN-FILM TRANSISTOR AND WIRING MATRIX DEVICE AND ITS FORMING METHOD

BACKGROUND OF THE INVENTION

1. Field of the Invention

The present invention relates to a thin-film transistor device.

More particularly, the invention relates to a thin-film transistor device that has an insulating interlevel wiring dielectric layer formed simultaneously with a gate insulating layer.

2. Background Art

Thin-film transistors which employ thin amorphous semiconductor films as active layers are increasingly used as switching devices or as circuits for driving image sensors because they are easy to fabricate. Also, devices with a large area can be easily manufactured.

In forming an array of thin-film transistors which comprises a plurality of thin-film transistors arranged on a single substrate, it is often required to provide a multi-level wiring section by such means as matrix wiring. A multi-level wiring section is commonly produced by the following method. A gate array of thin-film transistors and a first wiring layer are formed. Then, thin-film transistors are formed by successively depositing a gate insulating layer, an active layer, a source electrode and a drain electrode. Thereafter, an insulating interlevel dielectric layer and a second wiring layer are successively deposited.

The interlevel insulating dielectric layer in the multi-level wiring section is conventionally formed of an organic film made of a polymer such as polyimide The polyimide film can be deposited with a highly flat surface so that, unlike an inorganic film made of silicon oxide or other inorganic materials, it will not increase the unevenness already introduced by the thickness of the first level pattern. This flatness serves to ensure the integrity of the second level pattern which would otherwise be interrupted at step edges of the first level pattern to thereby impair the reliability of the device.

The polyimide film, however, has the disadvantage of being highly susceptible to pin hole formation and a dual structure must be employed in order to prevent unwanted shorts between the first and second level patterns. But the provision of a double-layered polyimide film increases the complexity of the device fabrication process.

SUMMARY OF THE INVENTION

The principal object, therefore, of the present invention is to provide a thin-film transistor device that is easy to fabricate.

This object can be attained by a thin-film transistor device including a multi-level wiring section which employs an inorganic insulating interlevel dielectric film that is formed in the same step as the formation of a gate insulating film. Since the insulating interlevel dielectric film in the multi-level wiring section is formed simultaneously with the gate insulating film, the thin-film transistor device of the present invention can be fabricated by a simplified process.

DESCRIPTION OF THE PREFERRED EMBODIMENT

A preferred embodiment of the present invention is hereunder described in detail with reference to the accompanying drawings.

Figure 1:
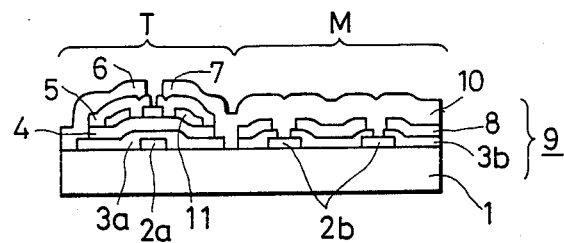
FIG. 1 is a cross section of a thin-film transistor device fabricated in accordance with one embodiment of the present invention.

FIG. 1 is a sectional view of a thin-film transistor device fabricated in accordance with the present invention. This device is composed of a transistor unit T and a matrix wiring section M connected thereto. The transistor unit T is composed of a plurality of thin-film transistors arranged on a line over a glass substrate 1. Each of the thin-film transistors is composed of a chromium (Cr) layer serving as a gate electrode 2a, a silicon nitride (SiNx) layer serving as a gate insulating film 3a, an intrinsic hydrogenated amorphous silicon (a-Si:H) layer serving as a semiconductor layer 4, an (n+) hydrogenated amorphous silicon layer serving as an ohmic contact layer 5, aluminum (Al) layers serving as source and drain electrodes 6 and 7, and a top insulating layer 11 made of a silicon nitride film.

The matrix wiring section M is composed of a first wiring layer 2b which is a chromium layer formed in the same step as the formation of the gate electrode 2a. A double-layered insulating interlevel dielectric layer 9 consists of a first insulating layer 3b which is a silicon nitride layer formed in the same step as the formation of the gate insulating film 3a and a second insulating layer 8 made of a polyimide. A second wiring layer 10 is an aluminum layer formed in the same step as the formation of the source electrode 6 as drain electrode 7.

Figure 2A:
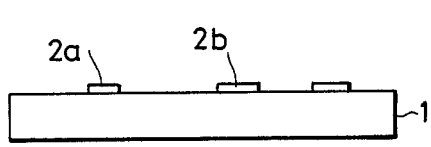
FIGS. 2A to 2G show the sequence of steps for fabricating the device of FIG. 1.

The process of fabricating the above-described device is depicted in FIG. 2A to 2G. First, a chromium layer 70 nm thick is deposited on a glass substrate 1 by evaporation and patterned by photolithographically etching to form a gate electrode 2a in the transistor unit T and a first wiring layer 2b in the matrix wiring section M (FIG. 2A). Shown for the next series of steps in FIG. 2B, there is first deposited a silicon nitride layer 3 having a thickness of 300 nm from which a gate insulating film 3a in the transistor unit T and a first insulating film 3b in the matrix wiring section M are to be formed Then, there is deposited an intrinsic hydrogeneted amorphous silicon layer 4 serving as a semiconductor layer 4 for the transistor unit T. Finally, there is deposited a silicon nitride film 11' with a thickness of 200 nm serving as a top insulating film which protects the semiconductor layers 4 in the transistor unit T. All the depositions are successively performed by a plasma-assisted CVD technique.

Figure 2E:
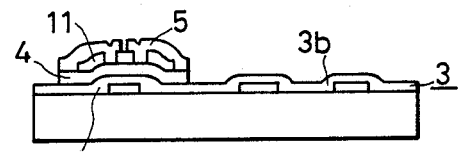
Figure 2B:
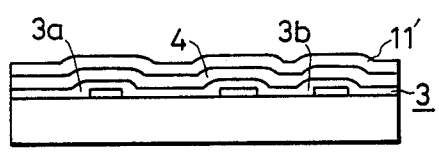
Figure 2F:
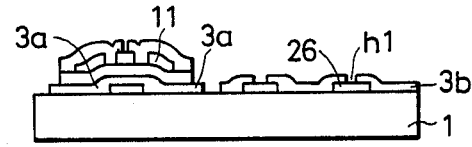
Figure 2C:
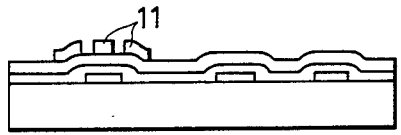

Subsequently, the silicon nitride film 11' serving as a protective layer 11 for the semiconductor layer 4 is patterned by photolithographic etching (FIG. 2C). An ohmic contact layer 5 is then formed by depositing an (n+) hydrogenated amorphous silicon layer 5 in a thickness of 50 nm by a plasma-assisted CVD technique (FIG. 2D). The hydrogenated amorphous silicon layers 4 and 5 are simultaneously patterned (FIG. 2E). The transistor unit T and the matrix wiring section M are provided with a defined gate insulating film 3a and a defined insulating interlevel dielectric film 3b, respectively, by predetermined patterning (FIG. 2F). Patterning of the gate insulating film 3a and the first insulating film 3b will simultaneously achieve the formation of contact holes h1 that establish electrical contact between the first wiring layer 2b and a second wiring layer which is to be formed at a later stage.

Figure 2G:
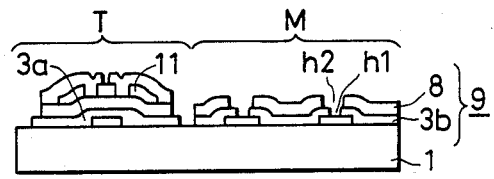
Figure 2D:
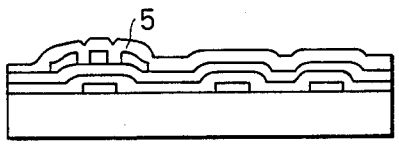

In the next step, a polyimide layer 8 serving as a second insulating film is coated to a thickness of about 1 micrometer and is patterned by photolithographic etching so as to form contact holes h2 in registry with the contact holes h1 in the first insulating film 3b (FIG. 2G).

Finally, an aluminum layer about 1.5 micrometers thick is deposited by evaporation and patterned by photolithographic etching to form source and drain electrodes 6 and 7 in the transistor unit T and a second wiring layer 10 in the matrix wiring section M, thus completing the process of fabricating the thin-film transistor device shown in FIG. 1. As shown in FIG. 1, the aluminum layer is continuous between the drain electrode 7 and the first wiring layer 2b through the contact holes h1 and h2. Thereby, the transistor unit T and the matrix wiring section M are electrically connected.

In accordance with the present invention, the insulating interlevel dielectric film in the matrix wiring section of a thin-film transistor device that has a dual structure composed of a silicon nitride layer and polyimide layer can be formed very easily and with high reliability by depositing a polyimide layer over the silicon nitride layer that has been formed simultaneously with the gate insulating film. This dual structure ensures the insulation integrity of the interlevel dielectric to thereby achieve a marked improvement in device reliability.

Since the dual structure composed of inorganic and organic films ensures a high degree of insulation, it may be as thin as about 1.3 micrometers to achieve the desired insulation integrity although the conventional dual structure which is composed of two polyimide films requires a thickness of about 2 micrometers. This allows correspondingly shallow contact holes to be made in the insulating interlevel dielectric film, so that the thickness of the second wiring layer can be reduced and high-density and precise patterning is achieved without causing any problem such as interrupted insulation at the edges of the contact holes.

It should be noted here that the polyimide film serving as the second insulating layer is not essential and may be omitted if desired. The first insulating layer does not need to be a silicon nitride film and may be formed of other inorganic materials such as silicon oxides (e.g.-,$SiO_2$), silicon carbides and tantalum oxides. The second insulating layer is not limited to a polyimide film, either, and may be formed of other organic films As described in the foregoing pages, the thin-film transistor device of the present invention employs an insulating interlevel dielectric layer in the wiring section that is formed simultaneously with the gate insulating film in the transistor unit. This enables highly reliable thin-film transistor devices to be fabricated by a highly simplified and straight forward manufacturing process.

What is claimed is:

1. A thin-film transistor device, comprising:
   a substrate;
   a thin-film transistor formed on said substrate including a first conducting layer deposited on said substrate, a gate insulating layer deposited on said first conducting layer, a semiconductor layer deposited on said gate insulating layer, and source and drain electrodes deposited on said semiconductor layer; and
   a multi-level wiring section including a first conducting wiring layer deposited on said substrate, a wiring insulating layer deposited on said first conducting wiring layer, and a second conducting wiring layer deposited on said wiring insulating layer, contacting said first conducting wiring layer and electrically connected to a portion of said thin-film transistor;
   said gate insulating layer and said wiring insulating layer being made of a same inorganic material and being of the same thickness.

2. A thin-film transistor device as recited in claim 1, wherein said second conducting wiring layer is continuous with at least one of said source and drain electrodes.

3. A thin-film transistor device as recited in claim 2, wherein said source and drain electrodes and said second conducting wiring layer are of a same material and a same thickness.

4. A thin-film transistor device as recited in claim 3, wherein said semiconductor layer comprises amorphous silicon.

5. A thin-film transistor device as recited in claim 3, further comprising an organic insulating layer deposited on said wiring insulating layer, said second conducting wiring layer being deposited on said organic insulating layer.

6. A thin-film transistor device as recited in claim 5, wherein said organic insulating layer comprises polyimide.

7. A thin-film transistor device as recited in claim 6, wherein said gate insulating layer and said wiring insulating layer are composed of a material selected from the group consisting of silicon nitrides, silicon carbides and tantalum oxides.

8. A thin-film transistor device as recited in claim 5, wherein a total thickness of said organic insulating layer and said wiring insulating layer is less than 2 micrometers.

* * * * *